United States Patent
Xu et al.

(10) Patent No.: US 10,599,907 B2
(45) Date of Patent: Mar. 24, 2020

(54) DISPLAY PANEL FOR FINGERPRINT RECOGNITION AND DISPLAY DEVICE

(71) Applicant: BOE TECHNOLOGY GROUP CO., LTD., Beijing (CN)

(72) Inventors: Rui Xu, Beijing (CN); Xue Dong, Beijing (CN); Jing Lv, Beijing (CN); Haisheng Wang, Beijing (CN); Yingming Liu, Beijing (CN); Xiaoliang Ding, Beijing (CN); Changfeng Li, Beijing (CN); Yannan Jia, Beijing (CN); Lijun Zhao, Beijing (CN); Yuzhen Guo, Beijing (CN); Pengpeng Wang, Beijing (CN); Yanling Han, Beijing (CN); Wei Liu, Beijing (CN); Chun-Wei Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 76 days.

(21) Appl. No.: 15/558,696

(22) PCT Filed: Feb. 10, 2017

(86) PCT No.: PCT/CN2017/073212
§ 371 (c)(1),
(2) Date: Sep. 15, 2017

(87) PCT Pub. No.: WO2017/219677
PCT Pub. Date: Dec. 28, 2017

(65) Prior Publication Data
US 2018/0239942 A1 Aug. 23, 2018

(30) Foreign Application Priority Data
Jun. 23, 2016 (CN) .......................... 2016 1 0466587

(51) Int. Cl.
*G06K 9/00* (2006.01)
*H01L 27/32* (2006.01)
(Continued)

(52) U.S. Cl.
CPC .......... *G06K 9/0004* (2013.01); *H01L 27/323* (2013.01); *H01L 27/3234* (2013.01); *H01L 51/5237* (2013.01); *H01L 27/14678* (2013.01)

(58) Field of Classification Search
CPC ............ G06K 9/0004; H01L 27/14678; H01L 27/323; H01L 27/3234; H01L 51/5237
See application file for complete search history.

(56) References Cited

U.S. PATENT DOCUMENTS

2008/0121442 A1* 5/2008 Boer ................... G06F 3/0412
178/18.09
2011/0176577 A1 7/2011 Bandara et al.
(Continued)

FOREIGN PATENT DOCUMENTS

CN 101777577 A 7/2010
CN 102612677 A 7/2012
(Continued)

OTHER PUBLICATIONS

First Office Action for Chinese Patent Application No. 201610466587.4 dated Oct. 26, 2018.
(Continued)

*Primary Examiner* — Bhavesh M Mehta
*Assistant Examiner* — Ian L Lemieux
(74) *Attorney, Agent, or Firm* — Calfee, Halter & Griswold LLP

(57) ABSTRACT

A display panel for fingerprint recognition and a display device are disclosed. The display panel for fingerprint recognition includes: a driving circuit backboard; a plurality of electroluminescent units disposed on the driving circuit
(Continued)

backboard in a form of array; a plurality of infrared luminescent units disposed on the driving circuit backboard in a form of array; a protection cover plate; and a plurality of infrared photosensitive induction units disposed in a form of array between the protection cover plate and a film on which the infrared luminescent units are located.

20 Claims, 2 Drawing Sheets

(51) Int. Cl.
   *H01L 51/52* (2006.01)
   *H01L 27/146* (2006.01)

(56) References Cited

U.S. PATENT DOCUMENTS

| | | | | |
|---|---|---|---|---|
| 2015/0155400 | A1* | 6/2015 | Xue | G06F 3/0412 257/53 |
| 2015/0331508 | A1* | 11/2015 | Nho | G06F 3/0421 345/173 |
| 2015/0364107 | A1 | 12/2015 | Sakariya et al. | |
| 2016/0049614 | A1* | 2/2016 | Gao | G02B 5/3033 257/40 |
| 2016/0293585 | A1* | 10/2016 | Geiger | H01L 27/14618 |
| 2016/0365535 | A1* | 12/2016 | Jiang | H01L 51/56 |
| 2018/0150165 | A1* | 5/2018 | Kim | G06F 3/0412 |
| 2019/0013368 | A1* | 1/2019 | Chung | H01L 27/3213 |
| 2019/0340409 | A1* | 11/2019 | Zhu | H01L 27/3211 |

FOREIGN PATENT DOCUMENTS

| | | |
|---|---|---|
| CN | 103440824 A | 12/2013 |
| CN | 103530609 A | 1/2014 |
| CN | 104009067 A | 8/2014 |
| CN | 104318204 A | 1/2015 |
| CN | 104318205 A | 1/2015 |
| CN | 104463107 A | 3/2015 |
| CN | 104866813 A | 8/2015 |
| CN | 105095883 A | 11/2015 |
| CN | 105183252 A | 12/2015 |
| CN | 105184248 A | 12/2015 |
| CN | 105304656 A | 2/2016 |
| CN | 106056099 A | 10/2016 |
| KR | 20110095565 A | 8/2011 |

OTHER PUBLICATIONS

Search Report and Written Opinion for International Application No. PCT/CN2017/073212 dated May 15, 2017.

Third Office Action for Chinese Patent Application No. 201610466587.4 dated Jun. 17, 2019.

* cited by examiner

US 10,599,907 B2

DISPLAY PANEL FOR FINGERPRINT RECOGNITION AND DISPLAY DEVICE

CROSS-REFERENCE TO RELATED APPLICATIONS

This application is based upon International Application No. PCT/CN2017/073212, filed on Feb. 10, 2017, which is based upon and claims priority to Chinese Patent Application No. 201610466587.4 filed in China on Jun. 23, 2016, the entire contents of which are hereby incorporated by reference.

TECHNICAL FIELD

The present disclosure relates to the field of display technology, and more particularly to a display panel for fingerprint recognition and a display device.

BACKGROUND

With the rapid development of display technology, display panels having fingerprint recognition function have been widely used in people's life. At present, display panels for fingerprint recognition generally use a capacitor structure to implement the fingerprint recognition function. For example, in a built-in display panel for fingerprint recognition, a capacitive fingerprint recognition component is disposed inside the display panel, which facilitates the lighting and thinning of the display panel, however, the capacitive fingerprint recognition component easily produces parasitic capacitance with components inside the display panel, such that a fingerprint recognition detection signal and a display signal interfere with each other, thereby influencing quality of the fingerprint recognition.

SUMMARY

Embodiments of the present disclosure provide a display panel for fingerprint recognition and a display device.

In an aspect, the embodiments of the present disclosure provide a display panel for fingerprint recognition, including: a driving circuit backboard, a plurality of electroluminescent units disposed on the driving circuit backboard in a form of array, a plurality of infrared luminescent units disposed on the driving circuit backboard in a form of array, a protection cover plate, and a plurality of infrared photosensitive induction units disposed in a form of array between the protection cover plate and a film on which the infrared luminescent units are located.

In another aspect, the embodiments of the present disclosure provide a display device including the display panel for fingerprint recognition provided by the embodiments of the present disclosure.

DETAILED DESCRIPTION

Figure 1:
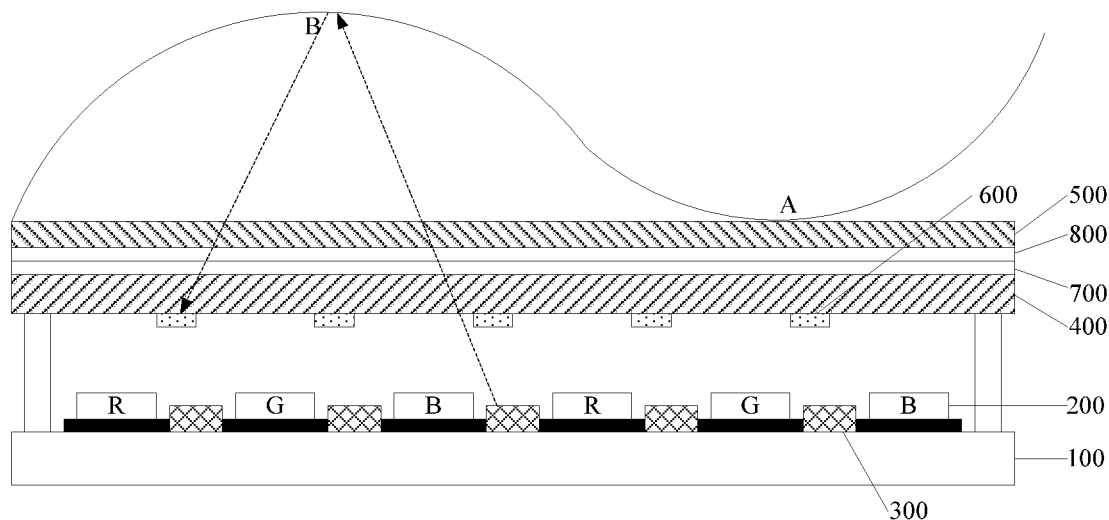
FIG. 1 is a schematic diagram illustrating a display panel for fingerprint recognition provided by an embodiment of the present disclosure.

Detailed embodiments of a display panel for fingerprint recognition and a display device provided by embodiments of the present disclosure will be described in detail below in conjunction with the accompanying drawings.

Shapes and sizes of components in the drawings do not reflect the true scales thereof, and they are merely for the purpose of illustration of the contents of the present disclosure.

Figure 2:
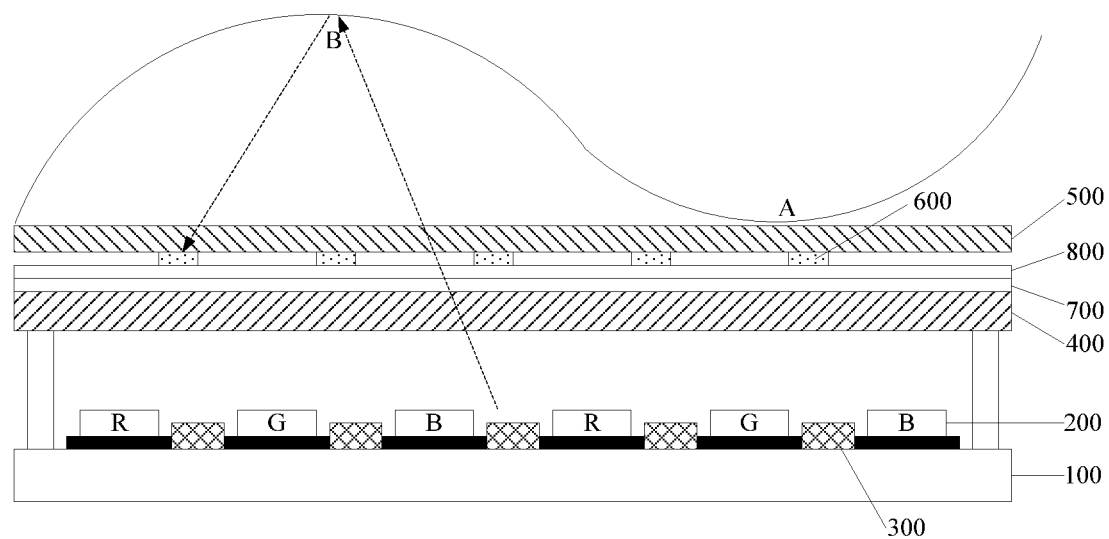
FIG. 2 is a schematic diagram illustrating a display panel for fingerprint recognition provided by an embodiment of the present disclosure.
Figure 3:
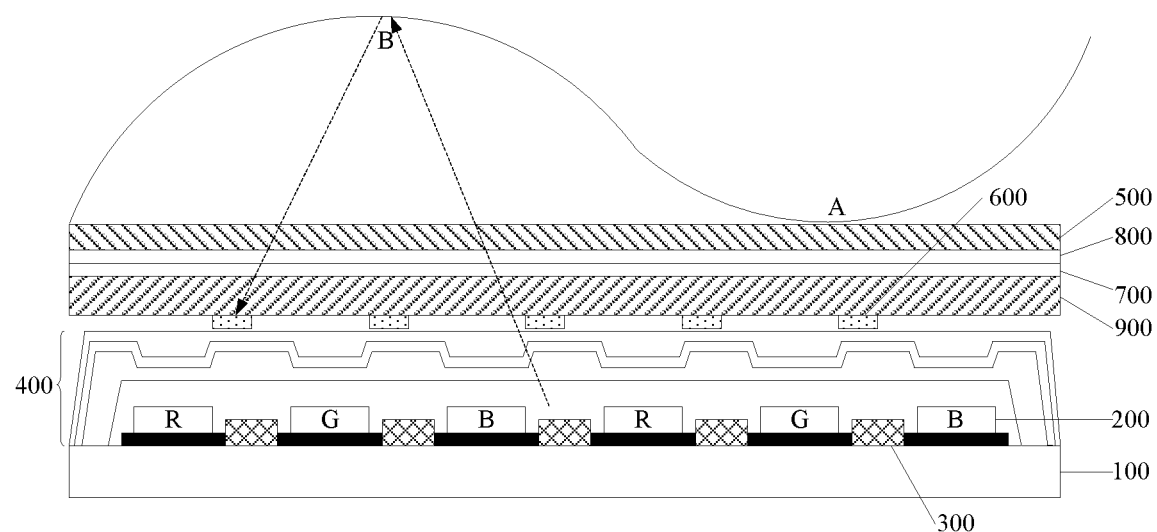
FIG. 3 is a schematic diagram illustrating a display panel for fingerprint recognition provided by an embodiment of the present disclosure.

The embodiments of the present disclosure provide a display panel for fingerprint recognition. As shown in FIGS. 1 to 3, the display panel for fingerprint recognition includes a driving circuit backboard 100, a plurality of electroluminescent units 200 disposed on the driving circuit backboard 100 in a form of array, a plurality of infrared luminescent units 300 disposed on the driving circuit backboard 100 in a form of array, an encapsulation component 400 configured to encapsulate the electroluminescent units 200 and the infrared luminescent units 300, a protection cover plate 500 disposed over the encapsulation component 400, and a plurality of infrared photosensitive induction units 600 disposed in a form of array between the protection cover plate 500 and a film on which the infrared luminescent units 300 are located.

In the above-mentioned display panel for fingerprint recognition provided by the embodiments of the present disclosure, the plurality of infrared luminescent units 300 based on infrared photosensitive effect are integrated on the driving circuit backboard 100, and the plurality of infrared photosensitive induction units 600 are disposed between the protection cover plate 500 and the film on which the infrared luminescent units 300 are located. When a finger of a user is approaching a surface of the display panel, since the skin surface of the finger has uneven ridge A and valley B, infrared light emitted from the infrared luminescent units 300 is irradiated to positions of the ridge A and the valley B of the finger, and an intensities of lights reflected from the respective positions of the ridge A and the valley B to the infrared photosensitive induction units 600 are different. Generally, the intensity of light reflected from the ridge A of the finger to the infrared photosensitive induction units 600 is greater than the intensity of light reflected from the valley B of the finger to the infrared photosensitive induction units 600. When the finger is touching the surface of the display panel, by detecting a current signal outputted from the respective infrared photosensitive induction units 600 at every moment, a fingerprint two-dimensional pattern of the corresponding finger formed by the ridge A and the valley B can be detected, in this way, fingerprint recognition is realized. Since a wave band of the infrared light used for the fingerprint recognition is not overlapped with a wave band of visible light used for displaying, therefore, the displaying and the fingerprint recognition can be simultaneously performed. Furthermore, because the infrared photosensitive induction units 600 detect fingerprint based on the infrared photosensitive effect and does not easily interfere with the components inside the display panel, it is easy to implement fingerprint detection with high quality.

In a specific implementation, in the above-described display panel for fingerprint recognition provided by the embodiments of the present disclosure, in order that the infrared photosensitive induction units 600 can receive infrared light reflected by fingerprint, in general, the infrared photosensitive induction units 600 are required to be disposed in a film above the infrared luminescent units 300. Furthermore, in order to guarantee strength of the surface of the display panel, the infrared photosensitive induction units 600 are usually disposed between the protection cover plate 500 and the driving circuit backboard 100.

Specifically, in the above-described display panel for fingerprint recognition provided by the embodiments of the present disclosure, the positions of the infrared photosensitive induction units 600 can be specifically located according to the structure of the encapsulation component 400 configured to encapsulate the electroluminescent units 200 and the infrared luminescent units 300.

FIG. 1 is a schematic diagram illustrating a display panel for fingerprint recognition provided by an embodiment of the present disclosure. For example, as illustrated in FIG. 1, the encapsulation component 400 performs encapsulation by using an encapsulation cover plate, because the encapsulation cover plate has a certain strength, the respective infrared photosensitive induction units 600 can be disposed on a surface of the encapsulation cover plate facing the driving circuit backboard 100 with the use of the encapsulation cover plate. In this case, the infrared photosensitive induction units 600 are positioned inside the illustrated encapsulation. In this case, as shown in FIG. 1, in general, a polarizer 700 adhered to a surface of the encapsulation cover plate and an optical clear adhesive 800 (OCA) for fixing the protection cover plate 500 to a surface of the polarizer 700 may also be disposed between the encapsulation cover plate and the protection cover plate 500.

Alternatively, the protection cover plate 500 may also be used. FIG. 2 is a schematic diagram illustrating a display panel for fingerprint recognition provided by an embodiment of the present disclosure. As shown in FIG. 2, the respective infrared photosensitive induction units 600 are disposed on a surface of the protection cover plate 500 facing the driving circuit backboard 100. In this case, as illustrated in FIG. 2, generally, a polarizer 700 adhered to a surface of the encapsulation cover plate and an optical clear adhesive 800 (OCA) for fixing the protection cover plate 500 to a surface of the polarizer 700 may also be disposed between the encapsulation cover plate and the protection cover plate 500. Alternatively, a base substrate 900 may also be disposed on the surface of the protection cover plate 500 facing the driving circuit backboard 100, and the respective infrared photosensitive induction units 600 can be disposed on a surface of the base substrate 900 opposite to the protection cover plate 500.

FIG. 3 is a schematic diagram illustrating a display panel for fingerprint recognition provided by a third embodiment of the present disclosure. As shown in FIG. 3, the encapsulation component 400 is encapsulated by employing an encapsulation film, since the encapsulation film consists of multiple inorganic and organic films, and its strength is not enough to support the infrared photosensitive induction units 600, a base substrate 900 may be disposed on a surface of the protection cover plate 500 facing the driving circuit backboard 100, and the respective infrared photosensitive induction units 600 can be disposed on a surface of the base substrate 900 opposite to the protection cover plate 500. At this time, in general, as shown in FIG. 3, a polarizer 700 adhered to a surface of the base substrate 900 opposite to the infrared photosensitive induction units 600 and an optical clear adhesive 800 (OCA) for fixing the protection cover plate 500 to a surface of the polarizer 700 may also be disposed between the base substrate 900 and the protection cover plate 500.

Figure 4:
FIG. 4 is a schematic diagram illustrating an infrared photosensitive induction unit in a display panel for fingerprint recognition provided by an embodiment of the present disclosure.

In a specific implementation, in the above-described display panel for fingerprint recognition provided by the embodiment of the present disclosure, in order that the infrared photosensitive induction units 600 may convert infrared light reflected by the fingerprint into a current signal to be outputted, in general, as shown in FIG. 4, the respective infrared photosensitive induction unit 600 may include a transparent electrode layer 601, an infrared photosensitive diode 602 and a metal electrode layer 603 which are provided in a laminated manner, wherein the transparent electrode layer 601 is positioned nearest to the protection cover plate 500. Referring to FIG. 4, the infrared photosensitive induction units 600 directly disposed on a rear surface of the protection cover plate 500 shown in FIG. 2 is taken as an example, and the transparent electrode layer 601 such as ITO, the infrared photosensitive diode 602, and the metal electrode layer 603 can be sequentially fabricated on a surface of the protection cover plate 500, wherein one end of the infrared photosensitive diode 602 is connected to the transparent electrode layer 601, and the other end is connected to the metal electrode layer 603, and voltage may be applied to the infrared photosensitive diode 602 by the transparent electrode layer 601 connected thereto. A pattern of the metal electrode layer 603 is generally in the shape of wire, and may output a current signal of the infrared photosensitive diode 602.

During specific implementation, in the above-described display panel for fingerprint recognition provided by the embodiment of the present disclosure, the infrared photosensitive diode 602 may specifically adopt a PIN type infrared photosensitive diode.

During specific implementation, in the above-described display panel for fingerprint recognition provided by the embodiment of the present disclosure, the respective infrared luminescent units 300 may specifically include a cathode, an infrared luminescent layer and an anode which are disposed in a laminated manner. In order to save the manufacturing processes, the cathode of the respective infrared luminescent units 300 and a cathode of the respective electroluminescent units 200 may be an integral structure, i.e., a film without any pattern. Further, in order to simplify the manufacturing processes, the anode of the respective infrared luminescent units 300 and an anode of the electroluminescent units 200 may be disposed on the same layer.

During specific implementation, in the above-mentioned display panel for fingerprint recognition provided by the embodiments of the present disclosure, preferably, as illustrated in FIGS. 1 to 3, the respective infrared photosensitive induction units 600 and the respective infrared luminescent units 300 are in one-to-one correspondence. Certainly, one infrared photosensitive induction unit 600 may correspond to the plurality of infrared luminescent units 300, or the plurality of infrared photosensitive induction units 600 may correspond to one infrared luminescent unit 300, and no limitation will be imposed herein.

Further, in the above-described display panel for fingerprint recognition provided by the embodiments of the present disclosure, positions, at which the infrared photosensitive induction units 600 and the infrared luminescent units 300 are disposed, are not limited. Specifically, the infrared photosensitive induction units 600 and the infrared luminescent units 300 may be disposed only in a display region. In order to not influence normal displaying, as shown in FIGS. 1 to 3, orthographic projections of the respective infrared photosensitive induction units 600 and the respective infrared luminescent units 300 on the driving circuit backboard 100 shall be positioned at gaps between the respective electroluminescent units 200, i.e., positioned in a non-display region to avoid regions of the electroluminescent units 200. At this time, touch and detection function may also be accomplished while the fingerprint recognition is performed. Alternatively, the infrared photosensitive induction units 600 and the infrared luminescent units 300 may also be disposed only in a border region, i.e., orthographic projections of the infrared photosensitive induction units 600 and the infrared luminescent units 300 on the driving circuit backboard 100 are located in the border region outside the effective display region. Alternatively, the infrared photosensitive induction units 600 and the infrared luminescent units 300 may be disposed both in the effective display region and the border region, which is not limited herein.

Based on the same inventive concept, the embodiments of the present disclosure further provide a display device including the above-described display panel for fingerprint recognition provided by the embodiments of the present disclosure. The display device may be any product or component having display function, such as a mobile phone, a tablet PC, a TV, a display, a notebook computer, a digital photo frame, a navigator, and the like. The embodiment of the display device may refer to the embodiments of the above-described display panel for fingerprint recognition, and repetitions will be omitted herein.

In the above-described display panel for fingerprint recognition and the display device provided by the embodiments of the present disclosure, the plurality of infrared luminescent units based on infrared photosensitive effect are integrated on the driving circuit backboard, and the plurality of infrared photosensitive induction units are disposed inside the protection cover plate above the encapsulation component, which is configured to encapsulate the electroluminescent units and the infrared luminescent units, i.e., disposed between the protection cover plate and the film on which the infrared luminescent units are provided. When a finger of a user is touching a surface of the display panel, since the skin surface of the finger has uneven ridge and valley, infrared light emitted from the infrared luminescent units is irradiated to positions of the ridge and the valley of the finger, and intensities of lights reflected from the respective positions of the ridge and the valley to the infrared photosensitive induction units are different. The intensity of light is converted into a current signal to realize detection of fingerprint. The infrared photosensitive induction units detect fingerprint based on the infrared photosensitive effect and does not easily interfere with the components inside the display panel, it is easy to implement fingerprint detection with high quality.

Apparently, those skilled in the art would make various variations and modifications in the present disclosure without departing from the spirit and scope of the present disclosure. Thus, the present disclosure is intended to cover these variations and modifications if the modifications and variations fall into the scope of the claims of the present disclosure and its equivalent technology.

What is claimed is:

1. A display panel for fingerprint recognition, comprising:
a driving circuit backboard;
a plurality of electroluminescent units disposed on the driving circuit backboard in a form of array and comprising red electroluminescent units, blue electroluminescent units, and green electroluminescent units;
a plurality of infrared luminescent units disposed on the driving circuit backboard in a form of array;
a protection cover plate; and
a plurality of infrared photosensitive induction units disposed in a form of array between the protection cover plate and a film on which the infrared luminescent units are located,
wherein the infrared photosensitive induction unit is disposed between any adjacent two light units of the red electroluminescent units, blue electroluminescent units, and green electroluminescent units,
wherein each of the infrared photosensitive induction units comprises a transparent electrode layer, an infrared photosensitive diode and a metal electrode layer which are disposed in a laminated manner in a direction perpendicular to the protection cover plate.

2. The display panel for fingerprint recognition according to claim 1 further comprising an encapsulation component configured to encapsulate the electroluminescent units and the infrared luminescent units.

3. The display panel for fingerprint recognition according to claim 1, wherein each of the infrared photosensitive induction units is disposed on a surface of the protection cover plate facing the driving circuit backboard.

4. The display panel for fingerprint recognition according to claim 2, wherein the encapsulation component is an encapsulation film.

5. The display panel for fingerprint recognition according to claim 2, wherein the encapsulation component is an encapsulation cover plate.

6. The display panel for fingerprint recognition according to claim 2, wherein the encapsulation component is an encapsulation cover plate, and
each of the infrared photosensitive induction units is disposed on a surface of the encapsulation cover plate facing the driving circuit backboard.

7. The display panel for fingerprint recognition according to claim 1, wherein the transparent electrode layer is positioned closest to the protection cover plate.

8. The display panel for fingerprint recognition according to claim 7, wherein the infrared photosensitive diode is a PIN type infrared photosensitive diode.

9. The display panel for fingerprint recognition according to claim 1, wherein each of the infrared photosensitive induction units is corresponding to each of the infrared luminescent units.

10. The display panel for fingerprint recognition according to claim 9, wherein an orthographic projection of each of the infrared photosensitive induction units and an orthographic projection of each of the infrared luminescent units on the driving circuit backboard are positioned at a gap between the respective electroluminescent units.

11. The display panel for fingerprint recognition according to claim 9, wherein an orthographic projection of each of the infrared photosensitive induction units and an orthographic projection of each of the infrared luminescent units on the driving circuit backboard are located in a border region outside an effective display region.

12. The display panel for fingerprint recognition according to claim 10, wherein each of the infrared luminescent units comprises a cathode, an infrared luminescent layer and an anode which are disposed in a laminated manner, wherein,
the cathode of each of the infrared luminescent units and a cathode of each of the electroluminescent units are an integral structure.

13. A display device, comprising the display panel for fingerprint recognition according to claim 1.

14. The display device according to claim 13 comprising an encapsulation component configured to encapsulate the electroluminescent units and the infrared luminescent units.

15. The display device according to claim 13, wherein each of the infrared photosensitive induction units is disposed on a surface of the protection cover plate facing the driving circuit backboard.

16. The display device according to claim 13, wherein a base substrate is disposed on the surface of the protection cover plate facing the driving circuit backboard, and each of the infrared photosensitive induction units is disposed on a surface of the base substrate opposite to the protection cover plate.

17. The display device according to claim 14, wherein the encapsulation component is an encapsulation cover plate, and each of the infrared photosensitive induction units is disposed on a surface of the encapsulation cover plate facing the driving circuit backboard.

18. The display device according to claim 13, wherein each of the infrared photosensitive induction units comprises a transparent electrode layer, an infrared photosensitive diode and a metal electrode layer which are disposed in a laminated manner, wherein the transparent electrode layer is positioned closest to the protection cover plate.

19. The display panel for fingerprint recognition according to claim 1, wherein a base substrate is disposed on the surface of the protection cover plate facing the driving circuit backboard, and each of the infrared photosensitive induction units is disposed on a surface of the base substrate opposite to the protection cover plate.

20. The display panel for fingerprint recognition according to claim 7, wherein each of the infrared photosensitive induction units is corresponding to each of the infrared luminescent units.

* * * * *